(12) United States Patent
Ono

(10) Patent No.: US 8,810,992 B2
(45) Date of Patent: Aug. 19, 2014

(54) ELECTROSTATIC CHUCK

(75) Inventor: Hiroshi Ono, Kirishima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/639,283

(22) PCT Filed: Jul. 26, 2011

(86) PCT No.: PCT/JP2011/066924
§ 371 (c)(1),
(2), (4) Date: Nov. 16, 2012

(87) PCT Pub. No.: WO2012/014873
PCT Pub. Date: Feb. 2, 2012

(65) Prior Publication Data
US 2013/0120896 A1    May 16, 2013

(30) Foreign Application Priority Data
Jul. 26, 2010    (JP) .................................. 2010-167247

(51) Int. Cl.
| | |
|---|---|
| *H01L 21/683* | (2006.01) |
| *H01T 23/00* | (2006.01) |
| *C04B 35/185* | (2006.01) |
| *C04B 35/581* | (2006.01) |
| *C04B 35/111* | (2006.01) |
| *C04B 35/195* | (2006.01) |

(52) U.S. Cl.
CPC ....... *H01L 21/683* (2013.01); *C04B 2235/5436* (2013.01); *C04B 35/185* (2013.01); *C04B 35/581* (2013.01); *C04B 2235/3262* (2013.01); *C04B 2235/3418* (2013.01); *C04B 35/111* (2013.01); *C04B 2235/72* (2013.01); *C04B 2235/3206* (2013.01); *C04B 2235/3208* (2013.01); *H01L 21/6833* (2013.01); *C04B 2235/61* (2013.01); *C04B 2235/6025* (2013.01); *C04B 2235/3272* (2013.01); *C04B 2235/5445* (2013.01); *C04B 2235/3241* (2013.01); *C04B 2235/3232* (2013.01); *C04B 35/195* (2013.01)
USPC ........................................................ 361/234

(58) Field of Classification Search
USPC ........................................................ 361/234
See application file for complete search history.

(56) References Cited

U.S. PATENT DOCUMENTS

| 6,174,583 B1 * | 1/2001 | Yamada et al. ................. 428/67 |
| 2006/0217259 A1 | 9/2006 | Teratani et al. |

FOREIGN PATENT DOCUMENTS

| JP | 5129421 | 5/1993 |
| JP | 11265930 | 9/1999 |

(Continued)

OTHER PUBLICATIONS

Japanese Office Action, Japanese Patent Application No. 2012-526504, Jun. 25, 2013, 4 pp.

(Continued)

*Primary Examiner* — Dharti Patel
(74) *Attorney, Agent, or Firm* — Volpe and Koenig, P.C.

(57) ABSTRACT

There is provided an electrostatic chuck an electrostatic chuck in which it is hard for the power of suppressing residual adsorption to deteriorate over time. There is provided an electrostatic chuck including an insulating substrate, and an adsorption electrode, wherein a region which includes at least an upper face of the insulating substrate containing Mn is made of ceramics containing a first transition element composed of at least one of Fe and Cr, and a ratio C2/C1 of a content C2 (mol) of the first transition element to a content C1 (mol) of Mn contained in the insulating substrate is 1 or more.

4 Claims, 3 Drawing Sheets

(56) References Cited

FOREIGN PATENT DOCUMENTS

| | | | |
|---|---|---|---|
| JP | 2005340442 | A | 12/2005 |
| JP | 2006273584 | | 10/2006 |
| JP | 2007112694 | A | 5/2007 |
| WO | 2009102589 | | 8/2009 |

OTHER PUBLICATIONS

International Search Report, PCT/JP2011/066924, Oct. 3, 2011, 1 pp.

* cited by examiner (a)

(b)

ELECTROSTATIC CHUCK

FIELD OF INVENTION

The present invention relates to an electrostatic chuck used to hold in an immobilizing manner, adjust, and transport a work piece such as a silicon wafer for semiconductor application or the like without causing impairments such as the work piece becoming undetachable over time in film forming apparatuses or etching apparatuses such as PVD apparatuses, CVD apparatuses, ion plating apparatuses, and vapor deposition apparatuses.

BACKGROUND

Conventionally, in film forming apparatuses or etching apparatuses such as PVD apparatuses, CVD apparatuses, ion plating apparatuses, and vapor deposition apparatuses, in order to precisely immobilize a work piece such as a silicon wafer, the work piece is forcedly adsorbed to a flat and smooth finished surface of a plate-like member. As adsorption means for this purpose, an electrostatic chuck utilizing an electrostatic adsorptive force is used.

Such an electrostatic chuck used in these film forming apparatuses or etching apparatuses includes: an adsorption face that is formed as one of the main faces (one of the largest faces) of a plate-like insulating substrate made of ceramics; and an adsorption electrode that is inside the insulating substrate or on another main face (another largest face) of the insulating substrate; wherein an electrostatic adsorptive force is generated such as a Coulomb's force due to dielectric polarization or a Johnsen-Rahbek force due to a slight leakage current between the electrostatic chuck and a work piece through the application of a DC voltage to the adsorption electrode, thereby causing the work piece to be forcedly adsorbed and immobilized to the adsorption face.

In the electrostatic chuck, a lifting pin for detaching the work piece from the adsorption face is disposed so as to be freely projected from a peripheral portion of the adsorption face corresponding to a peripheral portion of the work piece.

Here, in a conventional electrostatic chuck used for plasma treatment, it is known that a so-called residual adsorption appears in which an adsorptive force is left even after DC voltage application to the adsorption electrode is cancelled. This residual adsorption appears in such a manner that fixed electric charges (positive holes) are generated on an insulating substrate when electrons are injected from plasma to the work piece, and, even after the DC voltage is turned off, the fixed electric charges (positive holes) are left on the insulating substrate.

Here, there has been a problem that, when an attempt is made to detach the work piece from the adsorption face using a lifting pin in a state where the residual adsorptive force is large, the work piece is deformed or damaged.

In order to address this problem, there has been a known method for removing fixed electric charges by performing plasma exposure (electron injection) with sufficient time in a state where the DC voltage is off. Furthermore, an electrostatic chuck has been proposed that has a stress sensor for detecting stress applied to a lifting pin and controls movement of the lifting pin (see Patent Literature 1). It is possible to suppress a work piece from being deformed or damaged by using this fixed electric charge removing method and this electrostatic chuck.

CITATION LIST

Patent Literature

Patent Literature 1: Japanese Unexamined Patent Publication JP-A 5-129421(1993)

SUMMARY

Technical Problem

In the field of semiconductors using an electrostatic chuck, there is a demand for an improvement in added value and a reduction in cost by higher integration of ICs. As an important factor for satisfying this demand, it is required to reduce residual adsorption of the electrostatic chuck in order to shorten production tact time in each process.

However, in a case where the electrostatic chuck is used for a long period of time, and exposure of plasma (accelerated electrons having high energy) is continuously performed in order to remove fixed electric charges as described above, the power of suppressing residual adsorption deteriorates over time and the residual adsorption gradually increases, which leads to a problem that the plasma exposure ends up being meaningless for removing fixed electric charges.

The invention was made in view of the above-described problem, and it is an object thereof to provide an electrostatic chuck in which it is hard for the power of suppressing residual adsorption to deteriorate over time.

Solution to Problem

The invention provides an electrostatic chuck, including:
an insulating substrate; and
an adsorption electrode,
a region which includes at least an upper face of the insulating substrate being made of ceramics containing Mn and a first transition element composed of at least one of Fe and Cr, and
a ratio $C2/C1$ of a content $C2$ (mol) of the first transition element to a content $C1$ (mol) of Mn contained in the insulating substrate being 1 or more.

Advantageous Effects of Invention

According to the invention, it is possible to realize an electrostatic chuck from which a work piece can be easily detached because the power of suppressing residual adsorption does not deteriorate over time in a plasma environment.

BRIEF DESCRIPTION OF THE DRAWINGS

FIG. 1(a) is a top view of the electrostatic chuck, and FIG. 1(b) is a vertical cross-sectional view of the electrostatic chuck and a work piece;

DETAILED DESCRIPTION OF THE PREFERRED EMBODIMENTS

Hereinafter, an embodiment of an electrostatic chuck of the invention will be described in detail with reference to the drawings.

Figure 1:
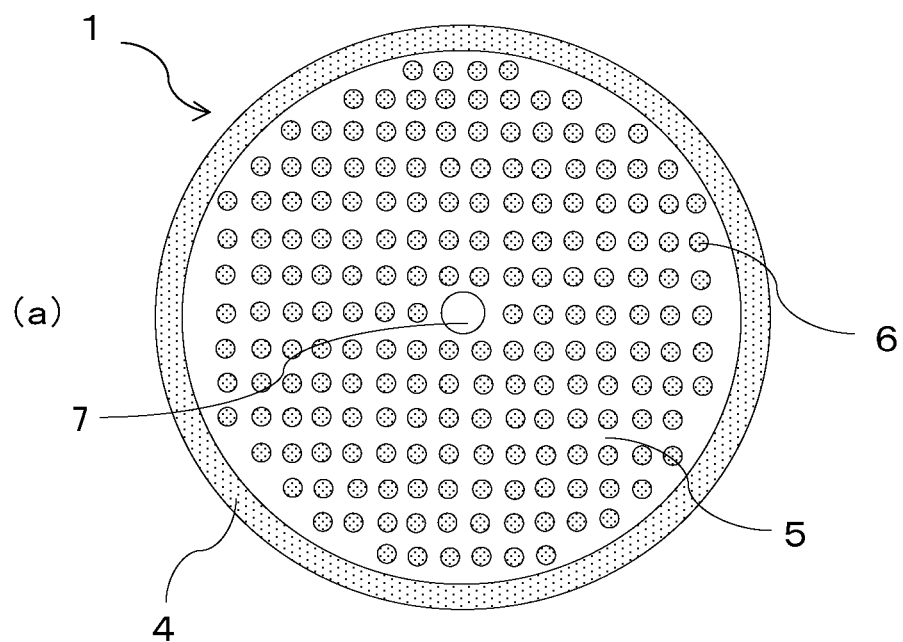
FIG. 1 is a diagram showing an embodiment of an electrostatic chuck of the invention, where
Figure 1:
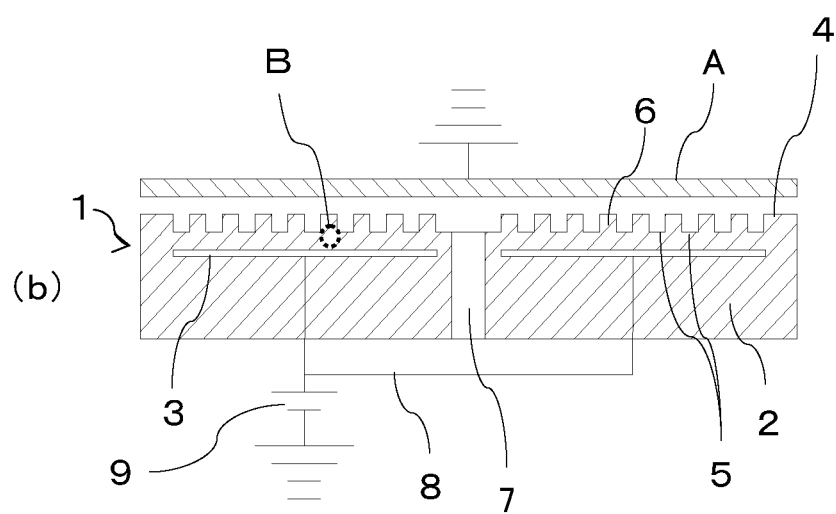

FIG. 1 is a diagram showing an embodiment of an electrostatic chuck of the invention, where FIG. 1(a) is a top view of the electrostatic chuck, and FIG. 1(b) is a vertical cross-sectional view of the electrostatic chuck and a work piece.

An electrostatic chuck 1 of the example shown in FIG. 1 is provided with an insulating substrate 2 and an adsorption electrode 3. Specifically, the insulating substrate 2 is formed in the shape of a disc having substantially the same size as that of a work piece A such as a silicon wafer, and the adsorption electrode 3 is embedded inside the insulating substrate 2.

As shown in FIG. 1, one main face of the insulating substrate 2 is provided with a large number of projections 6, each of which has a projecting end that is formed as a flat face. This face functions as an adsorption face. Note that the number of projections 6 is not limited to that of the pattern illustrated in the drawing.

The adsorption electrode 3 is connected to a lead wire 8, and the adsorption electrode 3 is connected via the lead wire 8 to a DC power source 9. Meanwhile, the work piece A that is to be adsorbed to the adsorption faces is electrically connected to earth directly or using plasma. Accordingly, an electrostatic adsorptive force acts between the adsorption electrode 3 and the work piece A, and, therefore, adsorptive immobilization is achieved.

A center portion of the insulating substrate 2 is provided with a gas introducing hole 7 that penetrates from another main face (lower face in the drawing) to the one main face (upper face in the drawing). Furthermore, gas channels 5 are formed between the projections 6, and the gas channels 5 and the gas introducing hole 7 are interconnected to each other. When the work piece A is adsorbed to the adsorption faces, coolant gas such as helium gas is supplied from the gas introducing hole 7 to a space defined by the work piece and the gas channels 5, thereby performing control such that good heat transfer is achieved between the gas channels 5 and the work piece A and between the adsorption faces and the work piece A and such that temperature distribution on the work piece A becomes uniform.

On the electrostatic chuck 1 shown in FIG. 1, a circumferential wall 4 is formed along the outer circumference of the one main face of the insulating substrate 2, and the space defined by the projections 6, the work piece A, and the gas channels 5 is a closed space, thereby preventing leakage of a large amount of coolant gas supplied from the gas introducing hole 7 to the outside. The circumferential wall 4 may be provided or may not be provided depending on the purpose. Furthermore, the circumferential wall 4 and the insulating substrate 2 may be unitarily formed or may be separately formed.

Examples of the material for forming the insulating substrate 2 include a material whose starting material is aluminum hydroxide obtained by purifying bauxite. This material contains a trace amount of Mn as incidental impurities of Al.

Figure 2:
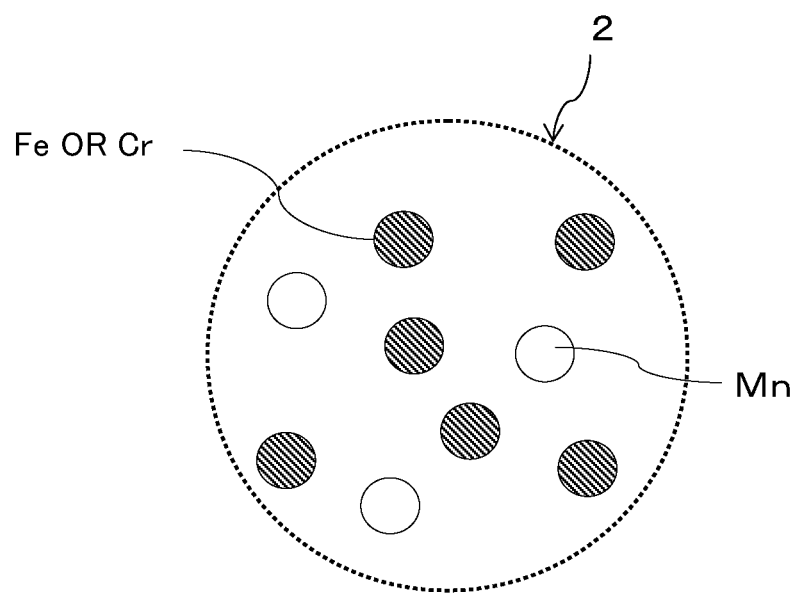
FIG. 2 is a diagram showing a quantitative concept of Mn, and Fe or Cr in the insulating substrate shown in FIG. 1.

It is important that, as shown in FIG. 2, a region which includes at least the upper face (the adsorption faces in a case where the projections 6 are formed) of the insulating substrate 2 is made of ceramics containing Mn and a first transition element that is at least one of Fe and Cr, and that a ratio C2/C1 of a content C2 (mol) of the first transition element to a content C1 (mol) of Mn contained in the insulating substrate is 1 or more. Note that "the region which includes the upper face" refers to, for example, a region having a thickness of 0.2 to 0.5 mm from the upper face. Here, FIG. 2 is a diagram showing a quantitative concept of Mn, and Fe or Cr in a region B indicated by the broken line in FIG. 1(b).

With this configuration, it is possible to realize an electrostatic chuck from which a work piece can be easily detached because the power of suppressing residual adsorption does not deteriorate over time in a plasma environment.

It seems that this effect is achieved by the following mechanism.

Residual adsorption appears in an outer layer of the insulating substrate 2 forming the electrostatic chuck, that is, an outer layer of ceramics containing a trace amount of Mn. Specifically, at the time of plasma exposure, Mn is oxidized from $Mn^{2+}$ to $Mn^{3+}$ using plasma energy as excitation energy. At that time, electric charges from Mn are used to reduce $Fe^{3+}$ and $Cr^{3+}$, and oxygen vacancies (positive holes) are formed inside the Mn oxide. These positive holes cause a slight surface current. This surface current appears as residual adsorption.

In order to prevent the power of suppressing residual adsorption from deteriorating over time, it is sufficient that, as shown in FIG. 2, the content of the first transition element that is at least one of Fe and Cr, which receives electric charges from Mn, is increased, that is, the ratio C2/C1 of the content C2 of the first transition element to the content C1 of Mn is 1 or more. Accordingly, electric charges are easily exchanged in a reversible manner between Mn and the first transition element (at least one of Fe and Cr), $Mn^{3+}$ easily returns to $Mn^{2+}$ corresponding to the ground state, and, therefore, formation of positive holes is effectively suppressed on the outer layer of the insulating substrate. On the other hand, in a case where C2/C1 is less than 1, electric charges are not effectively resupplied from Fe or Cr to $Mn^{3+}$, and it is hard for reduction to $Mn^{2+}$ to progress. Thus, the apparent excitation state continues, and the power of suppressing residual adsorption deteriorates over time.

This sort of effect is particularly significant when the insulating substrate 2 contains at least one of $Al_2O_3$, AlN, and $Al_2O_3$—$TiO_2$ as a major constituent. In this case, oxygen vacancies formed in the insulating substrate 2 function as charged particles (holes) and easily generate a leakage current.

Examples of the material for forming the adsorption electrode 3 include a metal such as platinum and W. The adsorption electrode 3 may be exposed on the another main face (lower face) of the insulating substrate 2, but is preferably embedded in the insulating substrate 2 as shown in the drawing.

Figure 3:
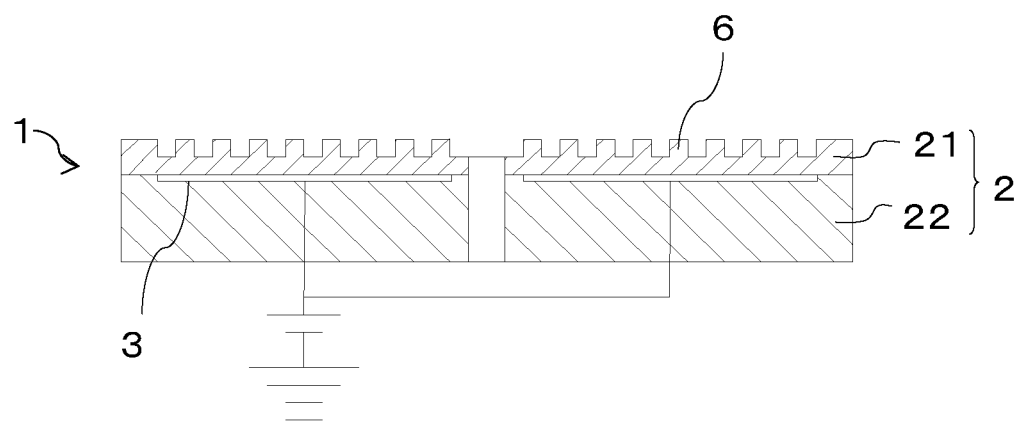
FIG. 3 is a vertical cross-sectional view showing another embodiment of the electrostatic chuck of the invention.

Furthermore, in a case where the adsorption electrode 3 is embedded inside the insulating substrate 2, it is preferable that an upper face-side region 21 of the insulating substrate 2 shown in FIG. 3 contains the first transition element (at least one of Fe and Cr), and that the ratio C2/C1 of the content C2 (mol) of the first transition element to the content C1 (mol) of Mn is 1 or more. FIG. 3 is a vertical cross-sectional view showing another embodiment of the electrostatic chuck of the invention. The "upper face-side region 21" refers to a region between the upper face (the adsorption faces in a case where the projections 6 are formed) of the insulating substrate 2 and the adsorption electrode 3, or a region between the upper face (the adsorption faces in a case where the projections 6 are formed) of the insulating substrate 2 and the adsorption electrode 3 and a region up to a position near the lower side of the adsorption electrode 3. Here, the "region up to a position near the lower side of the adsorption electrode 3" refers to a region that extends downward from the adsorption electrode 3 by about 0.5 mm.

The first transition element is contained only in the upper face-side region 21, and the ratio C2/C1 of the content C2 (mol) of the first transition element to the content C1 (mol) of Mn is 1 or more. Note that the thickness of the upper face-side region 21 is typically 0.2 to 0.5 mm.

In this region, in a case where C2/C1 is 1 or more, the power of suppressing residual adsorption does not deteriorate over time in a plasma environment, and, furthermore, regarding the temperature uniformity, the temperature unevenness can be alleviated because a region (a lower face-side region 22) other than the above-mentioned region in the insulating substrate 2 achieves low dielectric loss. The reason for this is that Fe impurities at the grain boundary are suppressed in the lower face-side region 22, which is a region other than the region relating to adsorption in the insulating substrate 2, and, therefore, the low dielectric loss can be maintained. The temperature uniformity of the insulating substrate itself in a high frequency environment can be preferably maintained when the lower face-side region 22 achieves low dielectric loss, because the total thickness of the upper face-side region 21 and the lower face-side region 22 is typically 2 to 10 mm, and the thickness of the lower face-side region 22 is larger than that of the upper face-side region 21.

Note that the content ratio of at least one of Fe and Cr is preferably 80 ppm or more. Accordingly, it becomes harder for the power of suppressing residual adsorption in the electrostatic chuck 1 to deteriorate over time. In a case where aluminum hydroxide obtained by purifying bauxite is used as a starting material as described above, MnO functioning as an Mn source is contained in an amount of approximately less than 80 ppm in terms of Mn. Thus, when the content ratio of the first transition element (at least one of Fe and Cr) in the insulating substrate 2 is 80 ppm or more, electrons are more effectively resupplied from the first transition element to $Mn^{3+}$. When the first transition element is contained only in the upper face-side region 21, the content ratio of the first transition element refers not to a ratio with respect to the entire insulating substrate 2 but to a ratio in a predetermined volume of only the upper face-side region 21. This ratio can be determined by extracting the predetermined portion of the insulating substrate 2 using a known method such as grinding, cutting, or polishing, and measuring the extracted portion using ICP mass spectrometry (ICP-MS).

The upper limit of the Fe amount in ceramics forming the insulating substrate 2 is preferably 500 ppm or less. Accordingly, the dielectric loss (tan δ) of the insulating substrate 2 can be made stably low, the porcelain heat generation of the insulating substrate in a high frequency environment is suppressed, and, therefore, the temperature unevenness (processing unevenness) in the adsorption faces can be suppressed. Fe impurities at the grain boundary are suppressed in the ceramics, and the low dielectric loss can be maintained. On the other hand, in a case where the upper limit is more than 500 ppm, the concentration of Fe impurities at the grain boundary increases, and the dielectric loss of the ceramics increases, and, therefore, the problem that the ceramics generates heat in a high-frequency region easily occurs. Note that, when the first transition element (at least one of Fe and Cr) is contained only in the upper face-side region 21, the upper limit of the Fe amount is determined not for the ratio with respect to the entire insulating substrate 2 but for the ratio in a predetermined volume of only the upper face-side region 21.

The foregoing embodiment is a specific description for elucidating the gist of the invention, and the invention is not limited to this.

Hereinafter, a method for producing the electrostatic chuck according to an embodiment of the invention will be described. In the following description, $Al_2O_3$ is used as an example, but the same production method can be applied also to AlN, $Al_2O_3$—$TiO_2$, and the like.

First, a predetermined amount of $Al_2O_3$ powder, which is a main starting material, is weighed, and subjected to wet pulverization mixing for 24 to 72 Hrs in a ball mill together with ion-exchanged water, solvent such as organic solvent, organic dispersant, and $Al_2O_3$ balls having a high purity of 99.6% or more.

The amounts of Mn, Fe, and Cr present in the $Al_2O_3$ powder, which is the main starting material, are identified in advance using ICP mass spectrometry (ICP-MS) or the like. Typically, these elements are present in the high-purity $Al_2O_3$ powder in the form of oxide such as MnO, $Fe_2O_3$, $Cr_2O_3$, and the like. In particular, MnO is present as Mn element in an amount of approximately 1 to 5 ppm (approximately $9.0 \times 10^{-9}$ to $9.2 \times 10^{-8}$ in terms of moles).

At the time of the wet pulverization mixing described above, a reagent $Fe_2O3$ or $Cr_2O_3$ is added such that the ratio C2/C1 of the content C2 (mol) of the first transition element that is at least one of Fe and Cr to the content C1 (mol) of Mn is 1 or more. Here, for example, iron oxide (III) in Cica special grade manufactured by Kanto Chemical Co., Inc. is used as $Fe_2O_3$, and chromium oxide (III) in Cica special grade manufactured by Kanto Chemical Co., Inc. is used as $Cr_2O_3$.

Predetermined amounts of organic binder such as polyvinyl alcohol, polyvinyl butyral, or acrylic resin, and auxiliary organic materials such as plasticizer or defoaming agent are added to the starting material slurry after the pulverization mixing, and mixed for another 24 to 48 Hrs. The organic-inorganic slurry mixture after the mixing is shaped into ceramic green sheets each having a thickness of 20 to 20000 μm, in particular 100 to 300 μm, using the doctor blade method, the calender roll method, press molding, extrusion molding, or the like.

Then, a paste-like electrode material such as platinum or tungsten for forming the adsorption electrode 3 is printed using known screen printing or the like on the ceramic green sheet for forming the insulating substrate 2.

The ceramic green sheet on which the paste-like electrode material has not been printed and the electrode-forming green sheet on which the paste-like electrode material has been printed are layered one on top of another such that the adsorption electrode 3 is formed at a predetermined position in the insulating substrate 2. The sheets are layered at a predetermined temperature with the application of a pressure of at least the yield strength of the ceramic green sheets. The method for applying the pressure may use known techniques such as uniaxial pressing or isostatic pressing (dry or wet).

Next, the obtained laminate is fired at a predetermined temperature in a predetermined atmosphere, forming an insulating substrate having an adsorption electrode embedded therein or formed on the surface thereof.

Note that, as the method for forming the projections 6 on the one main face (upper face) of the insulating substrate 2, known methods may be used such as sandblasting with masks, machining, or ultrasonic machining. Accordingly, it is possible to form projections 6 having a height of several micrometers to several tens of micrometers in a predetermined pattern shape.

With the above-described production method, it is possible to produce an electrostatic chuck in which the power of suppressing residual adsorption does not deteriorate over time in a plasma environment.

EXAMPLE 1

The electrostatic chucks 1 of the invention having the structure in FIG. 1 were produced as follows. Specifically, six types of materials listed below were used as the starting material of the insulating substrate 2.

As Material 1, an $Al_2O_3$ powder having a purity of 99.6 mass % was used. This $Al_2O_3$ powder had an average particle size D50 of 0.5 μm.

As Material 2, a mixture of an $Al_2O_3$ powder having a purity of 99.6 mass % (average particle size D50: 0.5 μm) and MgO, $SiO_2$, and CaO powders as sintering additives was used, wherein the $Al_2O_3$ powder was contained in a ratio of 98 mass % and the MgO, $SiO_2$, and CaO powders were contained in a ratio of 2 mass % in total.

As Material 3, an AlN powder having a purity of 99 mass % was used. This AlN powder had an average particle size D50 of 1.2 μm.

As Material 4, an $Al_2O_3$—$TiO_2$ powder obtained by mixing an $Al_2O_3$ powder having a purity of 99.6 mass % (average particle size D50: 0.5 μm) and a $TiO_2$ powder (average particle size D50: 0.7 μm) was used, wherein the $Al_2O_3$ powder was contained in a ratio of 99 mass % and the $TiO_2$ powder was contained in a ratio of 1 mass %.

As Material 5, a mullite ($3Al_2O_3.2SiO_2$) powder having a purity of 99 mass % was used. This mullite powder had an average particle size D50 of 0.6 μm.

As Material 6, cordierite ($2MgO.2Al_2O_3.5SiO_2$) powder having a purity of 99 mass % was used. This cordierite powder had an average particle size D50 of 0.9 μm.

Then, with respect to 100 mass parts of each of the starting material powders of Materials 1 to 6 as described above, 80 mass parts of toluene and 0.5 mass parts of dispersant were added, and the resultant was subjected to wet pulverization mixing for 48 Hrs in a ball mill together with high-purity $Al_2O_3$ balls having a diameter of 20 mm.

At the time of the wet pulverization mixing described above, a reagent $Fe_2O_3$ or $Cr_2O_3$ was added in the amounts listed in Table 1. Here, iron oxide (III) in Cica special grade manufactured by Kanto Chemical Co., Inc. was used as $Fe_2O_3$, and chromium oxide (III) in Cica special grade manufactured by Kanto Chemical Co., Inc. was used as $Cr_2O_3$. Furthermore, the amounts of Mn, Fe, and Cr present in each of the starting material powders were identified in advance using ICP mass spectrometry (ICP-MS).

Next, a plasticizer and a binder were added to this slurry after the wet pulverization mixing. Specifically, with respect to 100 mass parts of the starting material powder, each of DBP and DOP was added in an amount of 2 mass parts as the plasticizer, and polyvinyl butyral was added in an amount of 12 mass parts in terms of solid content as the binder, and the resultant was subjected to wet mixing for another 30 Hrs.

Next, the organic-inorganic slurry mixture after the mixing was shaped into ceramic green sheets each having a thickness of 200 μm using the doctor blade method.

Next, a tungsten paste for forming the adsorption electrode was printed using screen printing on the ceramic green sheet for forming the insulating substrate.

The ceramic green sheet on which the tungsten paste had not been printed and the electrode-forming green sheet on which the tungsten paste had been printed were layered one on top of another such that the adsorption electrode was formed at a predetermined position in the insulating substrate. The sheets were layered at a temperature of 80° C. or more with the application of a pressure of at least the yield strength of the green sheets, specifically 5 MPa, using uniaxial pressing.

Next, the obtained laminate was fired for 3 Hrs in a reducing atmosphere at a predetermined temperature (1600° C. for those other than the starting material powders of Materials 3, 5, and 6, 2000° C. for the starting material powder of the material 3, and 1400° C. for the starting material powders of Materials 5 and 6).

The obtained insulating substrate was subjected to thickness processing by rotary grinding, provided with a gas introducing hole by machining, and further provided with projections having a height of 12 μm in a predetermined pattern shape using sandblasting with masks on the adsorption faces. Furthermore, metal terminals (not shown) were attached to the adsorption electrode by brazing, and, consequently, the electrostatic chuck was produced.

Then, the following evaluations were conducted inside a vacuum chamber heated by a halogen lamp such that the adsorption faces of the produced electrostatic chuck were at 140° C. Note that the temperature was heated to 140° C. in order to facilitate the exchange of electric charges between Mn, and Fe and Cr.

Regarding the adsorption of the electrostatic chuck, after plasma treatment (70 sec/cycle) was repeated 3000 times, a silicon wafer was adsorbed and immobilized by applying a predetermined voltage to the adsorption electrode for 300 seconds.

Subsequently, the voltage application to the adsorption electrode was stopped, and the residual adsorptive force one second after the stop was measured using a load cell. Note that the residual adsorptive force was measured by the load cell using a single crystal sapphire master, and it was determined that there was no residual adsorptive force at 1.5 Torr or less. The residual adsorptive force before the plasma treatment was less than 1.5 Torr in all samples.

Furthermore, for each sample, a test piece (thickness: 1 mm) produced by laminating sheets and fired in the same batch was prepared, and the dielectric loss at room temperature and 1 MHz was measured. The measurement was performed by HP-4278A manufactured by Hewlett-Packard Company using the bridge circuit method. Note that the size of the electrode was 37 mm in diameter (guard ring method).

The results are shown in Table 1.

TABLE 1

| Sample No. | Starting material (Material) | Material for insulating substrate | Mn [C1(mol)] | Fe [C2(mol)] | Fe [ppm] | Cr [C2(mol)] | Cr [ppm] | C2/C1 Molar ratio | Residual adsorptive force [Torr] | tanδ [×10⁻⁴] |
|---|---|---|---|---|---|---|---|---|---|---|
| *1 | 1 | 99.6%$Al_2O_3$ | $1.8 \times 10^{-8}$ | $1.0 \times 10^{-8}$ | 0.6 | 0 | 0 | 0.6 | 5.2 | 0.6 |
| 2 | 1 | 99.6%$Al_2O_3$ | $1.8 \times 10^{-8}$ | $1.8 \times 10^{-8}$ | 1.0 | 0 | 0 | 1.0 | 1.3 | 0.5 |
| 3 | 1 | 99.6%$Al_2O_3$ | $1.8 \times 10^{-8}$ | $1.3 \times 10^{-6}$ | $7.5 \times 10^1$ | 0 | 0 | 74.4 | 1.0 | 0.5 |
| 4 | 1 | 99.6%$Al_2O_3$ | $1.8 \times 10^{-8}$ | $1.4 \times 10^{-6}$ | $8.0 \times 10^1$ | 0 | 0 | 79.4 | 0.4 | 0.5 |
| 5 | 1 | 99.6%$Al_2O_3$ | $1.8 \times 10^{-8}$ | $8.0 \times 10^{-6}$ | $4.5 \times 10^2$ | 0 | 0 | 444.4 | 0.3 | 0.9 |
| 6 | 1 | 99.6%$Al_2O_3$ | $1.8 \times 10^{-8}$ | $9.0 \times 10^{-6}$ | $5.0 \times 10^2$ | 0 | 0 | 500.0 | 0.2 | 1.2 |
| 7 | 1 | 99.6%$Al_2O_3$ | $1.8 \times 10^{-8}$ | $9.5 \times 10^{-6}$ | $5.3 \times 10^2$ | 0 | 0 | 527.8 | 0.3 | 5.0 |
| *8 | 1 | 99.6%$Al_2O_3$ | $1.8 \times 10^{-8}$ | $2.0 \times 10^{-9}$ | 0.1 | $1.0 \times 10^{-8}$ | 0.5 | 0.7 | 5.9 | 0.8 |
| 9 | 1 | 99.6%$Al_2O_3$ | $1.8 \times 10^{-8}$ | $2.0 \times 10^{-9}$ | 0.1 | $1.8 \times 10^{-8}$ | 0.9 | 1.1 | 1.1 | 0.4 |
| 10 | 1 | 99.6%$Al_2O_3$ | $1.8 \times 10^{-8}$ | $2.0 \times 10^{-9}$ | 0.1 | $1.4 \times 10^{-6}$ | $7.4 \times 10^1$ | 79.6 | 1.0 | 0.5 |

TABLE 1-continued

| Sample No. | Starting material (Material) | Material for insulating substrate | Mn [C1(mol)] | Fe [C2(mol)] | Fe [ppm] | Cr [C2(mol)] | Cr [ppm] | C2/C1 Molar ratio | Residual adsorptive force [Torr] | tanδ [×10$^{-4}$] |
|---|---|---|---|---|---|---|---|---|---|---|
| 11 | 1 | 99.6%Al$_2$O$_3$ | 1.8 × 10$^{-8}$ | 2.0 × 10$^{-9}$ | 0.1 | 1.6 × 10$^{-6}$ | 8.3 × 10$^1$ | 89.0 | 0.4 | 0.6 |
| 12 | 1 | 99.6%Al$_2$O$_3$ | 1.8 × 10$^{-8}$ | 2.0 × 10$^{-9}$ | 0.1 | 8.7 × 10$^{-6}$ | 4.5 × 10$^2$ | 480.7 | 0.6 | 1.2 |
| 13 | 1 | 99.6%Al$_2$O$_3$ | 1.8 × 10$^{-8}$ | 2.0 × 10$^{-9}$ | 0.1 | 9.6 × 10$^{-6}$ | 5.0 × 10$^2$ | 534.0 | 0.5 | 3.2 |
| 14 | 1 | 99.6%Al$_2$O$_3$ | 1.8 × 10$^{-8}$ | 2.0 × 10$^{-9}$ | 0.1 | 1.0 × 10$^{-5}$ | 5.3 × 10$^2$ | 566.2 | 0.6 | 5.5 |
| *15 | 2 | 99.6%Al$_2$O$_3$ | 7.8 × 10$^{-8}$ | 6.0 × 10$^{-8}$ | 3.3 | 0 | 0 | 0.8 | 4.7 | 4.0 |
| 16 | 2 | 99.6%Al$_2$O$_3$ | 7.8 × 10$^{-8}$ | 7.8 × 10$^{-8}$ | 4.4 | 0 | 0 | 1.0 | 1.4 | 3.8 |
| 17 | 2 | 99.6%Al$_2$O$_3$ | 7.8 × 10$^{-8}$ | 9.5 × 10$^{-8}$ | 5.3 | 0 | 0 | 1.2 | 1.3 | 3.8 |
| 18 | 2 | 99.6%Al$_2$O$_3$ | 7.8 × 10$^{-8}$ | 1.3 × 10$^{-6}$ | 7.5 × 10$^1$ | 0 | 0 | 17.2 | 1.1 | 4.0 |
| 19 | 2 | 99.6%Al$_2$O$_3$ | 7.8 × 10$^{-8}$ | 1.4 × 10$^{-6}$ | 8.0 × 10$^1$ | 0 | 0 | 18.3 | 0.5 | 4.0 |
| 20 | 2 | 99.6%Al$_2$O$_3$ | 7.8 × 10$^{-8}$ | 9.0 × 10$^{-6}$ | 5.0 × 10$^2$ | 0 | 0 | 114.7 | 0.4 | 4.2 |
| 21 | 2 | 99.6%Al$_2$O$_3$ | 7.8 × 10$^{-8}$ | 9.5 × 10$^{-6}$ | 5.3 × 10$^2$ | 0 | 0 | 121.7 | 0.5 | 9.8 |
| *22 | 3 | AlN | 1.0 × 10$^{-8}$ | 0.8 × 10$^{-8}$ | 0.4 | 0 | 0 | 0.8 | 4.5 | 2.0 |
| 23 | 3 | AlN | 1.0 × 10$^{-8}$ | 1.0 × 10$^{-8}$ | 0.6 | 0 | 0 | 1.0 | 1.3 | 1.9 |
| 24 | 3 | AlN | 1.0 × 10$^{-8}$ | 1.3 × 10$^{-6}$ | 7.5 × 10$^1$ | 0 | 0 | 134.0 | 0.9 | 1.9 |
| 25 | 3 | AlN | 1.0 × 10$^{-8}$ | 1.4 × 10$^{-6}$ | 8.0 × 10$^1$ | 0 | 0 | 143.0 | 0.4 | 2.0 |
| 26 | 3 | AlN | 1.0 × 10$^{-8}$ | 9.0 × 10$^{-6}$ | 5.0 × 10$^2$ | 0 | 0 | 895.0 | 0.3 | 2.5 |
| 27 | 3 | AlN | 1.0 × 10$^{-8}$ | 9.5 × 10$^{-6}$ | 5.3 × 10$^2$ | 0 | 0 | 949.0 | 0.3 | 7.8 |
| *28 | 4 | Al$_2$O$_3$—TiO$_2$ | 1.8 × 10$^{-8}$ | 1.4 × 10$^{-8}$ | 0.8 | 0 | 0 | 0.8 | 5.6 | 3.4 |
| 29 | 4 | Al$_2$O$_3$—TiO$_2$ | 1.8 × 10$^{-8}$ | 1.8 × 10$^{-8}$ | 1.0 | 0 | 0 | 1.0 | 1.3 | 3.2 |
| 30 | 4 | Al$_2$O$_3$—TiO$_2$ | 1.8 × 10$^{-8}$ | 1.3 × 10$^{-6}$ | 7.5 × 10$^1$ | 0 | 0 | 74.4 | 1.1 | 3.3 |
| 31 | 4 | Al$_2$O$_3$—TiO$_2$ | 1.8 × 10$^{-8}$ | 1.4 × 10$^{-6}$ | 8.0 × 10$^1$ | 0 | 0 | 79.4 | 0.3 | 4.0 |
| 32 | 4 | Al$_2$O$_3$—TiO$_2$ | 1.8 × 10$^{-8}$ | 9.0 × 10$^{-6}$ | 5.0 × 10$^2$ | 0 | 0 | 497.2 | 0.2 | 4.2 |
| 33 | 4 | Al$_2$O$_3$—TiO$_2$ | 1.8 × 10$^{-8}$ | 9.5 × 10$^{-6}$ | 5.3 × 10$^2$ | 0 | 0 | 527.2 | 0.3 | 8.9 |
| *34 | 5 | Mullite | 9.2 × 10$^{-8}$ | 8.0 × 10$^{-8}$ | 4.4 | 0 | 0 | 0.9 | 5.6 | 17 |
| 35 | 5 | Mullite | 9.2 × 10$^{-8}$ | 9.2 × 10$^{-8}$ | 5.1 | 0 | 0 | 1.0 | 1.1 | 16 |
| *36 | 6 | Cordierite | 5.5 × 10$^{-8}$ | 4.0 × 10$^{-8}$ | 2.3 | 0 | 0 | 0.7 | 5.2 | 9.1 |
| 37 | 6 | Cordierite | 5.5 × 10$^{-8}$ | 5.5 × 10$^{-8}$ | 3.1 | 0 | 0 | 1.0 | 0.9 | 8.7 |

Asterisk(*) indicates sample out of scope of the invention.

According to Table 1, it is found that the samples other than those of Sample Nos. 1, 8, 15, 22, 28, 34, and 36 has a C2/C1 molar ratio of 1 or more, and that the residual adsorptive force is effectively suppressed.

The reason for this is that, at the time of plasma treatment, the greater the amount of first transition element present at that time, the first transition element being at least one of Fe and Cr and receiving electrons from Mn, the more effectively oxygen vacancies formed by oxidization from Mn$^{2+}$ to Mn$^{3+}$ is resupplied with electrons from Fe and/or Cr, and, therefore, Mn easily returns to Mn$^{2+}$ corresponding to the ground state, which means that continuous formation of oxygen vacancies (charged particles) is suppressed in the outer layer of the insulating substrate.

On the other hand, Sample Nos. 1, 8, 15, 22, 28, 34, and 36 had C2/C1 that was less than 1, and, therefore, Mn$^{3+}$ was not effectively resupplied with electrons from Fe and/or Cr, and it was hard for reduction to progress. Thus, the apparent excitation state continued, and residual adsorption (over-time deterioration due to repeated plasma treatment) significantly appeared.

Furthermore, regarding Material 1 (99.6 mass % Al$_2$O$_3$), the comparison between Sample Nos. 3 and 4 to which Fe was added and the comparison between Sample Nos. 10 and 11 to which Cr was added clearly show that, in a case where the content ratio of the first transition element (at least one of Fe and Cr) in ceramics for forming the insulating substrate was 80 ppm or more, Mn$^{3+}$ was more effectively resupplied with electrons from the first transition element, and the residual adsorptive force was effectively reduced. This effect is clearly shown by the comparison between Sample Nos. 18 and 19 in the case of Material 2 (98 mass % Al$_2$O$_3$), by the comparison between Sample Nos. 24 and 25 in the case of Material 3 (AlN), and by the comparison between Sample Nos. 30 and 31 in the case of Material 4 (Al$_2$O$_3$—TiO$_2$).

Furthermore, the comparisons between Sample No. 5 to 7 in the case of Material 1 (99.6 mass % Al$_2$O$_3$), between Sample Nos. 20 and 21 in the case of Material 2 (98 mass % Al$_2$O$_3$), between Sample Nos. 26 and 27 in the case of Material 3 (AlN), and between Sample Nos. 32 and 33 in the case of Material 4 (Al$_2$O$_3$—TiO$_2$) clearly show that the residual adsorptive force was effectively suppressed, and, in particular, when the Fe amount was 500 ppm or less, the low dielectric loss was maintained. This fact indicates that Fe impurities at the grain boundary were suppressed within an amount where the dielectric loss was not affected.

However, when the concentration of Fe impurities at the grain boundary was 500 ppm or more, the dielectric loss of the insulating substrate tended to increase. In this manner, it was seen that Fe in an amount of 500 ppm or more deteriorates the dielectric loss.

In summary, from Table 1, it is clear that the residual adsorptive force is lowered as a result of the amount of Fe and/or Cr to Mn regardless of the compositions of Materials 1 to 6.

EXAMPLE 2

The electrostatic chucks 1 of the invention having the structure in FIG. 3 were produced as follows.

An Al$_2$O$_3$ powder having a purity of 99.6 mass % (average particle size D50: 0.5 μm) was used as a starting material of the insulating substrate 2. With respect to 100 mass parts of the starting material powder, 80 mass parts of toluene and 0.5 mass parts of dispersant were added, and the resultant was subjected to wet pulverization mixing for 48 Hrs in a ball mill together with high-purity Al$_2$O$_3$ balls having a diameter of 20 mm.

At the time of the wet pulverization mixing described above, a sample to which a reagent Fe$_2$O$_3$ or Cr$_2$O$_3$ in an amount shown in Table 2 had been added and a sample to which the reagent had not been added were prepared. Here, regarding the sample to which reagent Fe$_2$O$_3$ or Cr$_2$O$_3$ had been added, iron oxide (III) in Cica special grade manufactured by Kanto Chemical Co., Inc. was used as $Fe_2O_3$, and chromium oxide (III) in Cica special grade manufactured by Kanto Chemical Co., Inc. was used as $Cr_2O_3$. Furthermore, the amounts of Mn, Fe, and Cr present in each of the starting material powders were identified in advance using ICP mass spectrometry (ICP-MS).

Subsequently, a plasticizer and a binder were added to this slurry after the wet pulverization mixing. Specifically, with respect to 100 mass parts of the starting material powder, each of DBP and DOP was added in an amount of 2 mass parts as the plasticizer, and polyvinyl butyral was added in an amount of 12 mass parts in terms of solid content as the binder, and the resultant was subjected to wet mixing for another 30 Hrs.

Next, the organic-inorganic slurry mixture after the mixing ($Fe_2O_3$ and $Ce_2O_3$ added sample and non-added sample) was shaped into ceramic green sheets each having a thickness of 200 μm using the doctor blade method.

Next, a tungsten paste for forming the adsorption electrode was printed using screen printing on the $Al_2O_3$ ceramic green sheet to which $Fe_2O_3$ and $Ce_2O_3$ had been added.

Then, as shown in FIG. 3, the $Al_2O_3$ ceramic green sheet to which $Fe_2O_3$ and $Ce_2O_3$ had been added but on which the tungsten paste had not been printed was layered on the adsorption face side, forming the upper face-side region 21, and the $Al_2O_3$ ceramic green sheet to which $Fe_2O_3$ and $Ce_2O_3$ had not been added was layered on the back face side, forming the lower face-side region 22, such that the adsorption electrode was formed at a predetermined position in the insulating substrate. At that time, the upper face-side region 21 and the lower face-side region 22 were layered at a temperature of 80° C. or more with the application of a pressure of at least the yield strength of the green sheets, specifically 5 MPa, using uniaxial pressing.

Here, a sample was also produced in which the $Al_2O_3$ ceramic green sheet to which $Fe_2O_3$ and $Ce_2O_3$ had been added was layered on the lower face (face on the side opposite the adsorption faces) of the adsorption electrode such that the thickness after firing was 0.5 mm or less.

Next, the obtained laminate was fired for 3 Hrs in a reducing atmosphere at a predetermined temperature (1600° C.), forming the insulating substrate porcelain.

Next, the obtained insulating substrate was subjected to thickness processing by rotary grinding such that the total thickness of the insulating substrate was 2 mm. At that time, the upper face-side region 21 was set to 0.35 μm. Subsequently, the insulating substrate was provided with a gas introducing hole by machining, and further provided with projections having a height of 12 μm in a predetermined pattern shape using sandblasting with masks on the adsorption faces. Furthermore, metal terminals (not shown) were attached to the adsorption electrode by brazing, and, consequently, the electrostatic chuck was produced, which was further attached to a cooling base plate (not shown).

Then, the following evaluations were conducted inside a vacuum chamber heated by a halogen lamp as in Example 1 such that the adsorption faces of the produced electrostatic chuck were at 140° C.

After plasma treatment (70 sec/cycle) was repeated 3000 times on the adsorption faces of the electrostatic chuck, a silicon wafer was adsorbed and immobilized by applying a predetermined voltage to the adsorption electrode for 300 seconds.

Subsequently, the voltage application to the adsorption electrode was stopped, and the residual adsorptive force one second after the stop was measured using a load cell. The residual adsorptive force before the plasma treatment was less than 1.5 Torr in all samples.

Furthermore, for each sample, a test piece (thickness: 1 mm) produced by laminating sheets and fired in the same batch was prepared, and the dielectric loss at room temperature and 1 MHz was measured. The measurement was performed by HP-4278A manufactured by Hewlett-Packard Company using the bridge circuit method. Note that the shape of the electrode was 37 mm in diameter (guard ring method).

Furthermore, an RF having a high frequency of 15 MHz was applied to the base plate of each sample, the surface of the electrostatic chuck surface was measured with an infrared thermometer, and the difference (ΔT) between the highest temperature and the lowest temperature was obtained.

The results are shown in Table 2.

TABLE 2

| Sample No. | Material for insulating substrate | Mn [C1(mol)] | Fe [C2(mol)] | Fe [ppm] | Cr [C2(mol)] | Cr [ppm] | C2/C1 Molar ratio | Thickness below adsorption electrode (mm) |
|---|---|---|---|---|---|---|---|---|
| | | | | Upper face-side region 21 | | | | |
| 1 | 99.6%$Al_2O_3$ | $1.8 \times 10^{-8}$ | $9.0 \times 10^{-6}$ | $5.0 \times 10^{2}$ | 0 | 0 | 500.0 | 0.0 |
| 2 | 99.6%$Al_2O_3$ | $1.8 \times 10^{-8}$ | $9.0 \times 10^{-6}$ | $5.0 \times 10^{2}$ | 0 | 0 | 500.0 | 0.0 |
| 3 | 99.6%$Al_2O_3$ | $1.8 \times 10^{-8}$ | $9.0 \times 10^{-6}$ | $5.0 \times 10^{2}$ | 0 | 0 | 500.0 | 0.3 |
| 4 | 99.6%$Al_2O_3$ | $1.8 \times 10^{-8}$ | $9.0 \times 10^{-6}$ | $5.0 \times 10^{2}$ | 0 | 0 | 500.0 | 0.5 |
| 5 | 99.6%$Al_2O_3$ | $1.8 \times 10^{-8}$ | $2.0 \times 10^{-9}$ | 0.1 | $9.6 \times 10^{-6}$ | $5.0 \times 10^{2}$ | 534.0 | 0.0 |
| 6 | 99.6%$Al_2O_3$ | $1.8 \times 10^{-8}$ | $2.0 \times 10^{-9}$ | 0.1 | $9.6 \times 10^{-6}$ | $5.0 \times 10^{2}$ | 534.0 | 0.0 |
| 7 | 99.6%$Al_2O_3$ | $1.8 \times 10^{-8}$ | $2.0 \times 10^{-9}$ | 0.1 | $9.6 \times 10^{-6}$ | $5.0 \times 10^{2}$ | 534.0 | 0.3 |
| 8 | 99.6%$Al_2O_3$ | $1.8 \times 10^{-8}$ | $2.0 \times 10^{-9}$ | 0.1 | $9.6 \times 10^{-6}$ | $5.0 \times 10^{2}$ | 534.0 | 0.5 |

| Sample No. | Mn [C1(mol)] | Fe [C2(mol)] | Cr [C2(mol)] | C2/C1 Molar ratio | Residual adsorptive force [Torr] | tanδ [×10$^{-4}$] | In-face temperature uniformity ΔT [° C.] |
|---|---|---|---|---|---|---|---|
| | Lower face-side region 22 | | | | | | |
| 1 | $1.8 \times 10^{-8}$ | $9.0 \times 10^{-6}$ | 0 | 500.0 | 0.3 | 1.2 | 1.1 |
| 2 | $1.8 \times 10^{-8}$ | $2.0 \times 10^{-9}$ | 0 | 0.1 | 0.2 | 0.2 | 0.1 |
| 3 | $1.8 \times 10^{-8}$ | $2.0 \times 10^{-9}$ | 0 | 0.1 | 0.3 | 0.3 | 0.3 |
| 4 | $1.8 \times 10^{-8}$ | $2.0 \times 10^{-9}$ | 0 | 0.1 | 0.2 | 0.6 | 0.6 |
| 5 | $1.8 \times 10^{-8}$ | $2.0 \times 10^{-9}$ | $9.6 \times 10^{-6}$ | 534.0 | 0.4 | 3.2 | 1.8 |
| 6 | $1.8 \times 10^{-8}$ | $2.0 \times 10^{-9}$ | 0 | 0.1 | 0.5 | 0.2 | 0.2 |

TABLE 2-continued

| | | | | | | | |
|---|---|---|---|---|---|---|---|
| 7 | $1.8 \times 10^{-8}$ | $2.0 \times 10^{-9}$ | 0 | 0.1 | 0.5 | 0.3 | 0.3 |
| 8 | $1.8 \times 10^{-8}$ | $2.0 \times 10^{-9}$ | 0 | 0.1 | 0.4 | 1.1 | 0.8 |

As is clear from Table 2, in a case where $Fe_2O_3$ and/or $Cr_2O_3$ was present at a high concentration only in the upper face-side region 21 (including a portion up to a point 0.5 mm directly below the adsorption electrode 3), the temperature uniformity (ΔT) in the adsorption faces in a high frequency environment was better than a case where $Fe_2O_3$ and/or $Cr_2O_3$ was present at a high concentration in a region up to the lower face-side region 22 (Sample Nos. 1 and 5).

This fact indicates that a region (the lower face-side region 22) other than the region relating to adsorption achieved low dielectric loss, and, therefore, regarding the temperature uniformity, the temperature unevenness was alleviated throughout the entire insulating substrate. Furthermore, since C2/C1 was 1 or more, the power of suppressing residual adsorption did not deteriorate over time.

REFERENCE SIGNS LIST

1: Electrostatic chuck
2: Insulating substrate
3: Adsorption electrode
4: Circumferential wall
5: Gas channel
6: Projection
7: Gas introducing hole
8: Lead wire
9: DC power source
21: Upper face-side region
22: Lower face-side region

What is claimed is:

1. An electrostatic chuck, comprising:
   an insulating substrate; and
   an adsorption electrode,
   a region which includes at least an upper face of the insulating substrate being made of ceramics containing Mn and a first transition element composed of at least one of Fe and Cr,
   a ratio C2/C1 of a content C2 (mol) of the first transition element to a content C1 (mol) of Mn contained in the insulating substrate being 1 or more, and
   the insulating substrate containing $Al_2O_3$ as a major constituent.

2. The electrostatic chuck according to claim 1, wherein the adsorption electrode is disposed inside the insulating substrate,
   an upper face-side region of the insulating substrate contains the first transition element, and the ratio C2/C1 of the content C2 to the content C1 is 1 or more.

3. The electrostatic chuck according to claim 1, wherein a content ratio of the at least one of Fe and Cr is 80 ppm or more.

4. The electrostatic chuck according to claim 1, wherein the ceramics contains Fe in a content ratio of 500 ppm or less.

* * * * *